United States Patent
Lee

(10) Patent No.: US 9,318,164 B2
(45) Date of Patent: Apr. 19, 2016

(54) SEMICONDUCTOR MEMORY DEVICE WITH POWER-SAVING SIGNAL

(71) Applicant: SK hynix Inc., Gyeonggi-do (KR)

(72) Inventor: Hyun Chul Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 154 days.

(21) Appl. No.: 14/168,777

(22) Filed: Jan. 30, 2014

(65) Prior Publication Data

US 2015/0117132 A1    Apr. 30, 2015

(30) Foreign Application Priority Data

Oct. 28, 2013    (KR) .................... 10-2013-0128382

(51) Int. Cl.
    *G11C 5/14*    (2006.01)
(52) U.S. Cl.
    CPC ..................................... *G11C 5/148* (2013.01)
(58) Field of Classification Search
    CPC .................................................. G11C 5/148
    See application file for complete search history.

(56) References Cited

U.S. PATENT DOCUMENTS

| 5,280,455 | A | * | 1/1994 | Kanaishi | G11C 5/147 307/64 |
| 6,243,281 | B1 | * | 6/2001 | Pereira | G06F 7/74 365/230.03 |
| 6,785,162 | B2 | * | 8/2004 | Naso | G11C 29/14 365/185.18 |
| 7,180,809 | B2 | * | 2/2007 | Lee | G11C 11/406 365/222 |
| 2003/0151957 | A1 | * | 8/2003 | Pekny | G11C 16/30 365/189.11 |

FOREIGN PATENT DOCUMENTS

KR    100826649    5/2008

\* cited by examiner

*Primary Examiner* — Harry W Byrne
*Assistant Examiner* — Lance Reidlinger
(74) *Attorney, Agent, or Firm* — IP & T Group LLP

(57) ABSTRACT

A semiconductor memory device includes a memory cell array, a voltage generator suitable for generating voltages used for controlling the memory cell array in response to a power-saving signal, and a control logic suitable for providing a power-saving signal to the voltage generator, based on a chip select signal. The control logic includes a delay block suitable for delaying the chip select signal and generating the power-saving signal based on the delayed chip select signal.

18 Claims, 9 Drawing Sheets

SEMICONDUCTOR MEMORY DEVICE WITH POWER-SAVING SIGNAL

CROSS-REFERENCES TO RELATED APPLICATION

The present application claims priority under 35 U.S.C. §119(a) to Korean application number 10-2013-0128382, filed on Oct. 28, 2013, in the Korean Intellectual Property Office, which is incorporated herein by reference in its entirety.

BACKGROUND

1. Technical Field

Various embodiments relate to a semiconductor design technology, and more particularly, to a semiconductor memory device and a data storage device including the same.

2. Related Art

Semiconductor memory devices are generally classified into volatile memory devices and nonvolatile memory devices. While a volatile memory device may lose stored data when power is turned off, a nonvolatile memory device may retain stored data even when not powered. The memory devices may include various types of memory cells.

The volatile memory devices may be classified into a static random access memory device (SRAM) and a dynamic random access memory device (DRAM), according to the types of memory cells. The nonvolatile memory devices may be classified into a flash memory device, a ferroelectric RAM (FRAM) using ferroelectric capacitors, a magnetic RAM (MRAM) using a tunneling magneto-resistive (TMR) layer, a phase change memory device (PCRAM) using a chalcogenide alloy, and a resistive memory device (ReRAM) using a transition metal oxide, according to the structures of memory cells.

A semiconductor memory device may be controlled by a chip select signal provided from an external device (e.g., a controller). For example, when the chip select signal is activated, the semiconductor memory device may operate in a normal mode in which it may perform a read operation, a write (or a program) operation or an erase operation. On the other hand, when the chip select signal is deactivated, the semiconductor memory device may operate in a power-saving mode in which it does not perform an internal operation. The semiconductor memory device is to be designed to stably enter an operation mode corresponding to the chip select signal.

SUMMARY

A semiconductor memory device capable of stably entering a power-saving mode based on a chip select signal, and a data storage device including the same are described herein.

In an embodiment of the present invention, a semiconductor memory device may include a memory cell array, a voltage generator suitable for generating voltages used for controlling the memory cell array in response to a power-saving signal, and a control logic suitable for providing the power-saving signal to the voltage generator, based on a chip select signal, wherein the control logic includes a delay block suitable for delaying the chip select signal and generating the power-saving signal based on the delayed chip select signal.

In an embodiment of the present invention, a data storage device may include a semiconductor memory device and a controller suitable for accessing the semiconductor memory device in response to a request from a host device. The semiconductor memory device may include a memory cell array, a voltage generator suitable for generating voltages used for controlling the memory cell array in response to a power-saving signal, and a control logic suitable for providing the power-saving signal to the voltage generator, based on a chip select signal, wherein the control logic includes a delay block suitable for delaying the chip select signal and generating the power-saving signal based on the delayed chip select signal.

In an embodiment of the present invention, a semiconductor memory device may include a memory cell array, a voltage generator suitable for generating voltages used for accessing the memory cell array in response to a power-saving signal, and a control logic suitable for generating the power-saving signal activated when the chip select signal retains a deactivated state for a reference period or longer after entry of a power-saving mode.

According to the embodiments of the present invention, a semiconductor memory device may stably operate. Thus, a data storage device including the semiconductor memory device may also stably operate.

BRIEF DESCRIPTION OF THE DRAWINGS

Features, aspects, and embodiments are described in conjunction with the attached drawings, in which.

DETAILED DESCRIPTION

Figure 1:
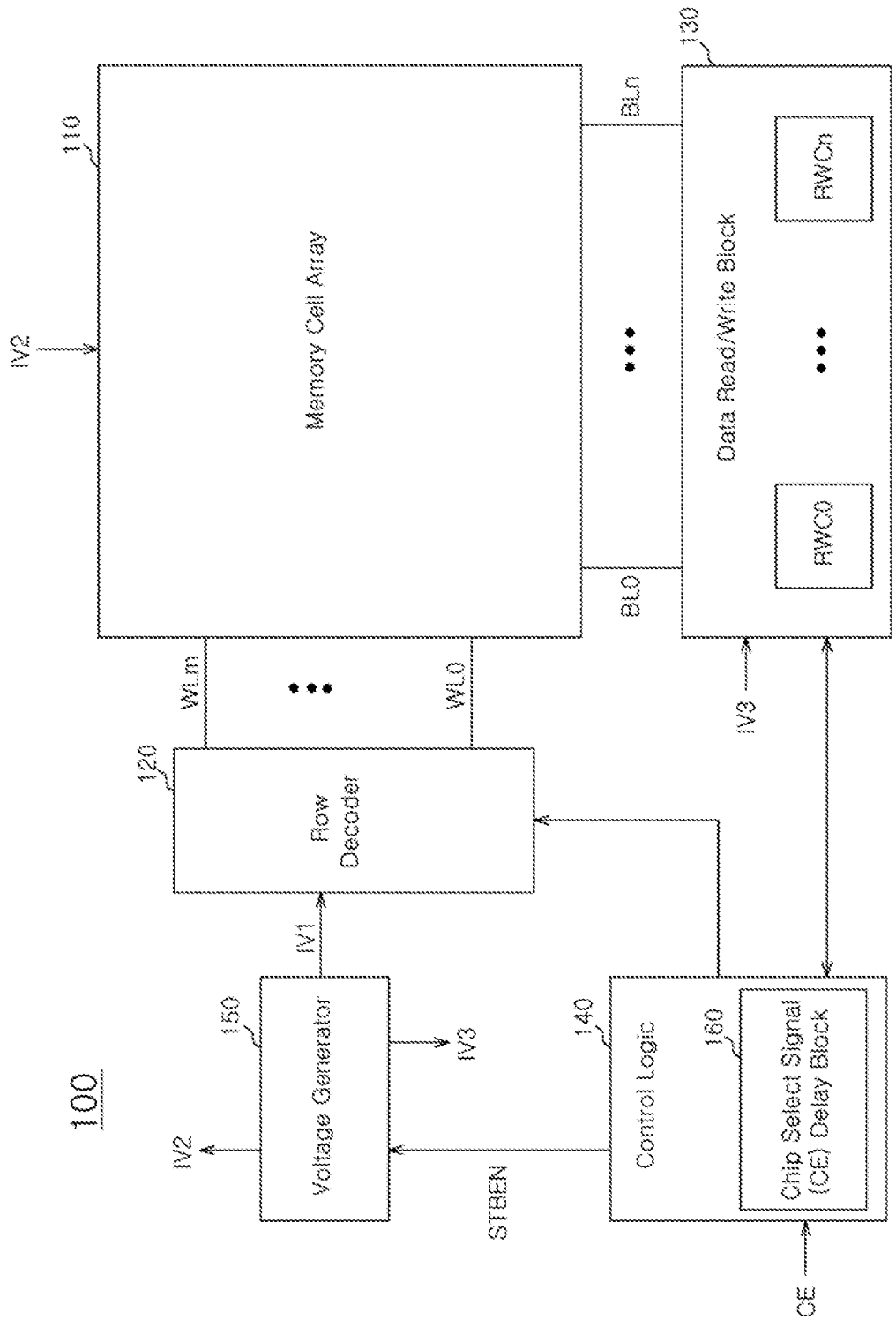
FIG. 1 is a block diagram illustrating a semiconductor memory device in accordance with an embodiment of the present invention.

In the present invention, advantages, features and methods for achieving them will become more apparent after a reading of the following exemplary embodiments taken in conjunction with the drawings. The present invention may, however, be embodied in different forms and should not be construed as being limited to the embodiments set forth herein. Rather, these embodiments are provided to describe the present invention in detail to the extent that a person skilled in the art to which the disclosure pertains can easily enforce the technical concept of the present invention.

It is to be understood herein that embodiments of the present invention are not limited to the particulars shown in the drawings and that the drawings are not necessarily to scale and in some instances proportions may have been exaggerated in order to more clearly depict certain features of the disclosure. While particular terminology is used herein, it is to be appreciated that the terminology used herein is for the purpose of describing particular embodiments only and is not intended to limit the scope of the present invention. Throughout the disclosure, reference numerals correspond directly to the like numbered parts in the various figures and embodiments of the present invention.

As used herein, the term "and/or" includes any and all combinations of one or more of the associated listed items. It will be understood that when an element is referred to as being "on," "connected to" or "coupled to" another element, it may be directly on, connected or coupled to the other element or intervening elements may be present. As used herein, a singular form is intended to include plural forms as well, unless the context clearly indicates otherwise. It will be further understood that the terms "includes" and/or "including," when used in this specification, specify the presence of at least one stated feature, step, operation, and/or element, but do not preclude the presence or addition of one or more other features, steps, operations, and/or elements thereof.

Hereinafter, a semiconductor memory device and a data storage device including the same according to the present invention will be described below with reference to the accompanying drawings through exemplary embodiments.

FIG. 1 is a block diagram illustrating a semiconductor memory device in accordance with an embodiment of the present invention. Referring to FIG. 1, a semiconductor memory device 100 may include a memory cell array 110, a row decoder 120, a data read/write block 130, a control logic 140, a voltage generator 150, and a chip select signal (CE) delay block 160.

The memory cell array 110 includes a plurality of memory cells, which are disposed at regions where word lines WL0 to WLm and bit lines BL0 to BLn cross each other. The respective memory cells may have a volatile characteristic or may have a nonvolatile characteristic. That is, the respective memory cells may be configured as volatile memory cells or may be configured as nonvolatile memory cells.

The row decoder 120 may be coupled with the memory cell array 110 through the word lines WL0 to WLm. The row decoder 120 may decode addresses, which are pre-decoded by the control logic 140. The row decoder 120 may perform a selecting operation and a driving operation for the word lines WL0 to WLm based on decoding results. For instance, the row decoder 120 may provide word line voltages, which are provided from the voltage generator 150, to selected word lines and unselected word lines, respectively.

The data read/write block 130 may be coupled to the memory cell array 110 through the bit lines BL0 to BLn. The data read/write block 130 may include read/write circuits RWC0 to RWCn, which respectively correspond to the bit lines BL0 to BLn. The respective read/write circuits RWC0 to RWCn may operate as write drivers or sense amplifiers based on an operation mode. For example, the respective read/write circuits RWC0 to RWCn may operate as write drivers in a write (or a program) operation. In the write operation, the respective read/write circuits RWC0 to RWCn may store the data provided from an external device, in the memory cell array 110. For another example, the respective read/write circuits RWC0 to RWCn may operate as sense amplifiers in a read operation. In the read operation, the respective read/write circuits RWC0 to RWCn may sense the data stored in the memory cell array 110 and read the data based on sensing results.

The control logic 140 may control operations such as a read operation, a write operation and an erase operation of the semiconductor memory device 100, based on control signals, which are provided from an external device. The control signals may include a chip select signal CE, a command, an address, etc. for controlling operations of the semiconductor memory device 100. The control logic 140 may control the row decoder 120, the data read/write block 130 and the voltage generator 150 based on control signals.

The voltage generator 150 may generate voltages, which are to be used in operations of the semiconductor memory device 100, under the control of the control logic 140. In other words, the voltage generator 150 may generate voltages to be used in controlling operations, for example, write, read and erase operations, of the memory cell array 110. For instance, the voltage generator 150 may generate an internal voltage IV1, which is to be applied to the word lines WL0 to WLm, and may apply the generated internal voltage IV1 to the row decoder 120. For another instance, the voltage generator 150 may generate an internal voltage IV2, which is to be applied to the memory cell array 110, and may apply the generated internal voltage IV2 to the memory cell array 110. For still another instance, the voltage generator 150 may generate an internal voltage IV3, which is to be applied to the data read/write block 130, and may apply the generated internal voltage IV3 to the data read/write block 130.

The control logic 140 may control the power-saving operation of the semiconductor memory device 100 based on the chip select signal CE. When an activated chip select signal CE is provided from an external device, the control logic 140 may activate the voltage generator 150 so that the semiconductor memory device 100 may operate in a normal mode (or in an activated state). When a deactivated chip select signal CE is provided, the control logic 140 may deactivate the voltage generator 150 so that the semiconductor memory device 100 may operate in a power-saving mode (or in a deactivated state).

For instance, when a predetermined time is passed after the deactivated chip select signal CE is provided, the control logic 140 will deactivate the voltage generator 150 so that the semiconductor memory device 100 may enter the power-saving mode. That is, control logic 140 generates the power-saving signal that is activated when the chip select signal retains a deactivated state for a reference period or longer after an entry of the power-saving mode.

In order to activate the voltage generator 150, the control logic 140 may provide a deactivated power-saving signal STBEN to the voltage generator 150. The voltage generator 150 may be activated in response to the deactivated power-saving signal STBEN. Namely, the voltage generator 150 may operate in the normal state. In this case, the voltage generator 150 may generate the internal voltages IV1 to IV3. In order to deactivate the voltage generator 150, the control logic 140 may provide an activated power-saving signal STBEN to the voltage generator 150. The voltage generator 150 may be deactivated in response to the activated power-saving signal STBEN. That is, the voltage generator 150 may operate in the power-saving state or a standby state. In this case, the voltage generator 150 may not generate the internal voltages IV1 to IV3.

The control logic 140 may control the semiconductor memory device 100 to stably enter the power-saving mode when the deactivated chip select signal CE is provided. To this end, the control logic 140 may include a chip select signal delay block 160. The chip select signal delay block 160 may delay the chip select signal CE (or edges of the chip select signal CE) provided from an external device (e.g., a controller), by a predetermined time. The chip select signal delay block 160 may generate the power-saving signal STBEN, which is to be provided to the voltage generator 150, based on the delayed chip select signal CE. Because the chip select signal CE may be delayed by the chip select signal delay block 160, even when the state of the chip select signal CE is abruptly or unstably changed, for example, from an activated state to a deactivated state or from a deactivated state to an activated state, the power-saving signal STBEN may be stably generated. That is, the control logic 160 may generate the power-saving signal STBEN activated when the chip select signal CE retains a deactivated state for a reference period or more after entry of a power-saving mode (PSM).

Figure 2:
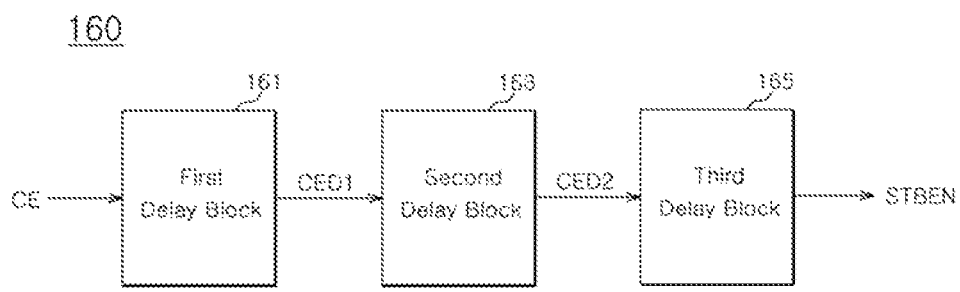
FIG. 2 is a block diagram illustrating a chip select signal delay block shown in FIG. 1.

FIG. 2 is a block diagram of the chip select signal delay block 160 shown in FIG. 1. Referring to FIG. 2, the chip select signal delay block 160 may include a first delay block 161, a second delay block 163, and a third delay block 165.

The first delay block 161 may generate a first delayed signal CED1, which is delayed for a first delay time based on the chip select signal CE inputted from the external device. When the chip select signal CE makes a transition from an activated state to a deactivated state, the first delay block 161 may generate the first delayed signal CED1, which is delayed in its transition time by the first delay time from the transition time of the chip select signal CE. When the chip select signal CE makes a transition from the deactivated state to the activated state, the first delay block 161 may generate the first delayed signal CED1, which has the same transition time as the chip select signal CE. Namely, the first delay block 161 may delay a deactivation edge of the chip select signal CE by the first delay time.

The second delay block 163 may generate a second delayed signal CED2, which is delayed for a second delay time (i.e., a reference period) based on the first delayed signal CED1 provided from the first delay block 161. The second delay block 163 may determine whether or not the first delayed signal CED1 is deactivated for a time longer than the second delay time. Because the first delayed signal CED1 is generated by delaying the chip select signal CE, the fact that the second delay block 163 determines whether or not the first delayed signal CED1 is deactivated may be the same as determining whether or not the chip select signal CE is deactivated. Therefore, the second delay block 163 may determine whether or not the chip select signal CE is deactivated for a time longer than the second delay time. The second delay block 163 may generate the second delayed signal CED2, which is activated, when the first delayed signal CED1 is deactivated for a time longer than the second delay time.

The third delay block 165 may generate the power-saving signal STBEN, which is delayed for a third delay time based on the second delayed signal CED2 provided from the second delay block 163. When the second delayed signal CED2 makes a transition from a deactivated state to an activated state, the third delay block 165 may generate the power-saving signal STBEN, which has the same transition time as the second delayed signal CED2. When the second delayed signal CED2 makes a transition from the activated state to the deactivated state, the third delay block 165 may generate the power-saving signal STBEN, which is delayed in its transition time by the third delay time from the transition time of the second delayed signal CED2. That is, the third delay block 165 may delay an activation edge of the second delayed signal CED2. Here, the third delay time of the third delay block 165 may be equal to or longer than the second delay time of the second delay block 163.

Figure 3:
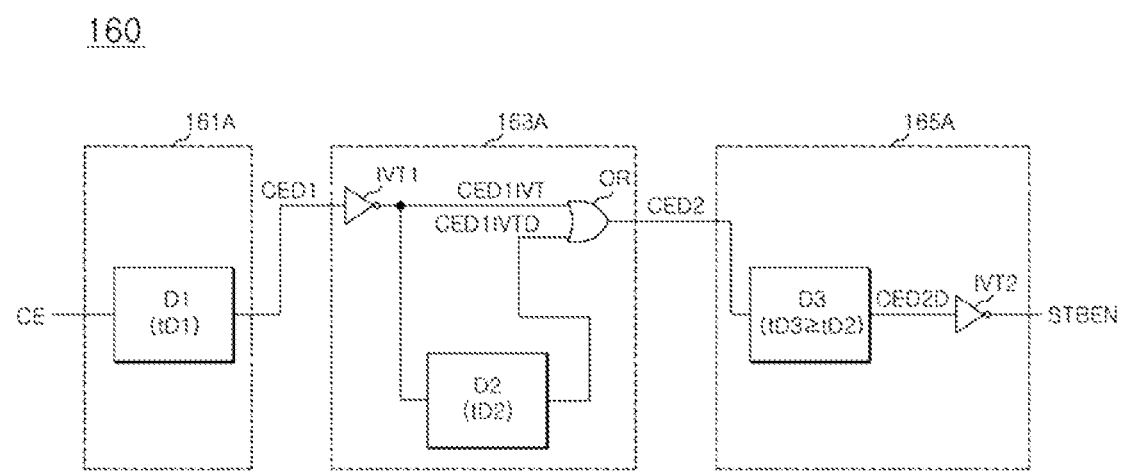
FIG. 3 is a detailed diagram illustrating an example of a chip select signal delay block shown in FIG. 1.

FIG. 3 is a detailed diagram illustrating the chip select signal delay block 160 shown in FIG. 1. Referring to FIG. 3, the chip select signal delay block 160 may include a first delay block 161A, a second delay block 163A, and a third delay block 165A.

The first delay block 161A may include a first delay circuit D1. The first delay circuit D1 may generate a first delayed signal CED1, which is delayed for a first delay time tD1 based on the inputted chip select signal CE.

The second delay block 163A may include a first inverter IVT1, a second delay circuit D2, and an OR circuit OR. The first inverter IVT1 may be coupled to the output terminal of the first delay circuit D1. The first inverter IVT1 may generate a first inverted signal CED1IVT by inverting the first delayed signal CED1. The second delay circuit D2 may be coupled to the output terminal of the first inverter IVT1. The second delay circuit D2 may generate an internal delayed signal CED1IVTD by delaying the first inverted signal CED1IVT by a second delay time tD2. The OR circuit OR may be coupled to the output terminal of the first inverter IVT1 and the output terminal of the second delay circuit D2. The OR circuit OR may compare the states of the first inverted signal CED1IVT and the internal delayed signal CED1IVTD and generate a second delayed signal CED2 based on a comparison result.

The third delay block 165A may include a third delay circuit D3 and a second inverter IVT2. The third delay circuit D3 may be coupled to the output terminal of the OR circuit OR. The third delay circuit D3 may generate an internal delayed signal CED2D by delaying the second delayed signal CED2 by a third delay time tD3 equal to or longer than the second delay time tD2. The second inverter IVT2 may be coupled to the output terminal of the third delay circuit D3. The second inverter IVT2 may generate the power-saving signal STBEN by inverting the internal delayed signal CED2D.

Figure 4:
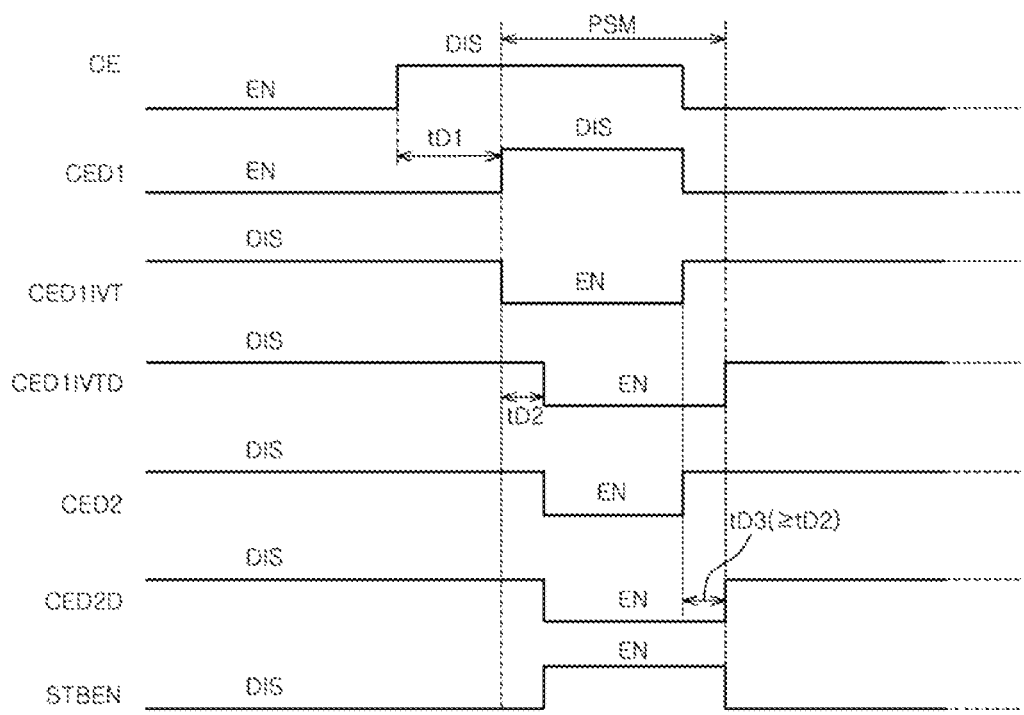
FIGS. 4 and 5 are timing diagrams for explaining operations of the chip select signal delay block shown in FIG. 3.

FIG. 4 is a timing diagram for explaining operations of the chip select signal delay block 160 shown in FIG. 3. A case in which the semiconductor memory device 100 starts a power-saving mode PSM when the predetermined time tD1 is passed after the chip select signal CE is deactivated as described above will be explained. Hereinafter, the operations of the chip select signal delay block in the case in which the chip select signal CE stably retains the deactivated state even after the power-saving mode PSM is started will be, explained with reference to FIGS. 3 and 4.

If the chip select signal CE makes a transition from an activated state EN to a deactivated state DIS, the first delay circuit D1 may generate the first delayed signal CED1 by delaying the chip select signal CE by the first delay time tD1. For instance, the first delay circuit D1 may generate the first delayed signal CED1, which is delayed in its transition time for a rising edge) by the first delay time tD1 only when the chip select signal CE makes a transition from the activated state EN to the deactivated state DIS.

The first inverter IVT1 may generate the first inverted signal CED1IVT by inverting the first delayed signal CED1. The second delay circuit D2 may generate the internal delayed signal CED1IVTD by delaying the first inverted signal CED1IVT by the second delay time tD2. The OR circuit OR may generate the second delayed signal CED2, which is activated, when both the first inverted signal CED1IVT and the internal delayed signal CED1IVTD are in activated states EN. By the OR circuit OR, it may be possible to determine whether the first delayed signal CED1 is deactivated for a time longer than the second delay time tD2.

The third delay circuit D3 may generate the internal delayed signal CED2D by delaying the second delayed signal CED2 by the third delay time tD3 equal to or longer than the second delay time tD2. For instance, the third delay circuit D3 may generate the internal delayed signal CED2D, which is delayed in its transition time (or a rising edge) by the third delay time tD3 only when the second delayed signal CED2 makes a transition from the activated state EN to the deactivated state DIS. The second inverter IVT2 may generate the power-saving signal STBEN by inverting the internal delayed signal CED2D.

Figure 5:
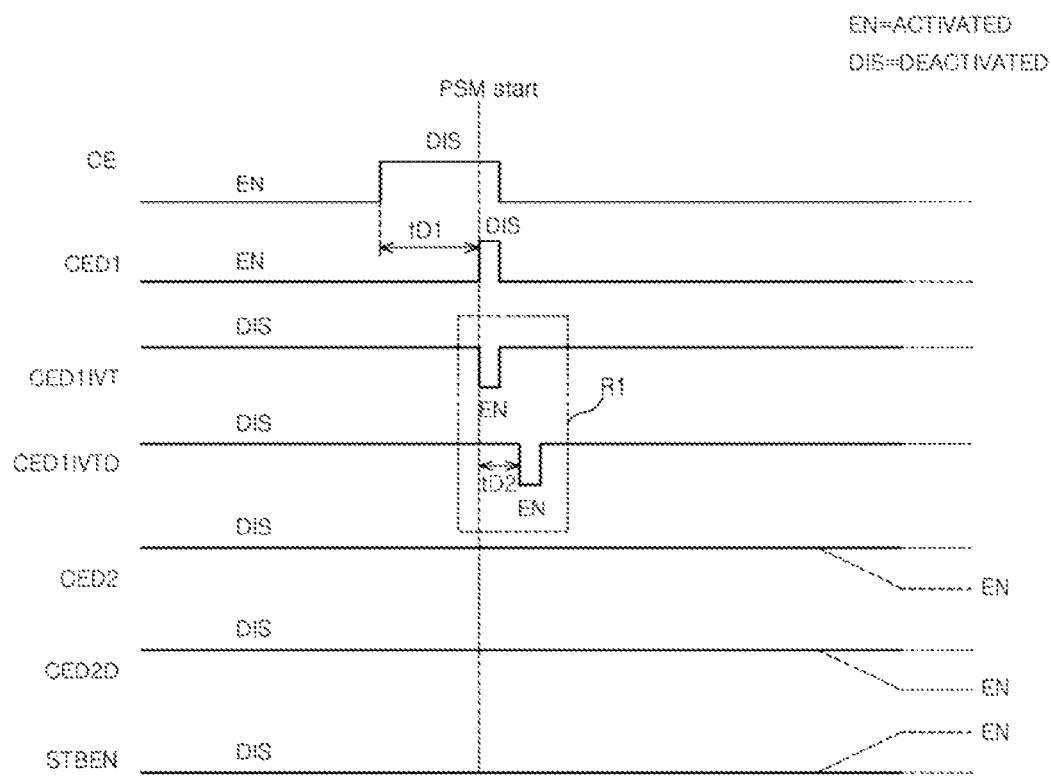

FIG. 5 is another timing diagram for explaining operations of the chip select signal delay block shown in FIG. 3. The case in which the semiconductor memory device 100 starts the power-saving mode PSM when the predetermined time tD1 is passed after the chip select signal CE is deactivated will be explained. Hereinafter, the operations of the chip select signal delay block in the case in which the chip select signal CE abruptly transitions to the activated state after the power-saving mode PSM is started will be explained with reference to FIGS. 3 and 5.

If the chip select signal CE makes a transition from the activated state EN to the deactivated state DIS, the first delay circuit D1 may generate the first delayed signal CED1 by delaying the chip select signal CE by the first delay time tD1. For instance, the first delay circuit D1 may generate the first delayed signal CED1, which is delayed in its transition time (or a rising edge) by the first delay time tD1 only when the chip select signal CE makes a transition from the activated state EN to the deactivated state DIS.

The first inverter IVT1 may generate the first inverted signal CED1IVT by inverting the first delayed signal CED1. The second delay circuit D2 may generate the internal delayed signal CED1IVTD by delaying the first inverted signal CED1IVT by the second delay time tD2. The OR circuit OR may generate the second delayed signal CED2, which is activated, when both the first inverted signal CED1IVT and the internal inverted signal CED1IVTD are in the activated states EN.

However, because the chip select signal CE abruptly makes a transition to the activated state EN at about the time when the power-saving mode PSM is just started (i.e., the first delayed signal CED1 does not retain the deactivated state DIS for a time longer than the second delay time tD2) and the first inverted signal CED1IVT is delayed by the second delay circuit D2, a case in which both the first inverted signal CED1IVT and the internal inverted signal CED1IVTD are in the activated states EN does not occur (see the region R1). For this reason, even though the power-saving mode PSM is started, the OR circuit OR may generate the second delayed signal CED2, which is deactivated.

The third delay circuit D3 may generate the internal delayed signal CED2D by delaying the second delayed signal CED2 by the third delay time tD3 equal to or longer than the second delay time tD2. Since the second delayed signal CED2, which is deactivated, is continuously inputted, the third delay circuit D3 will also continuously generate the internal delayed signal CED2D, which is deactivated. The second inverter IVT2 may generate the power-saving signal STBEN by inverting the internal delayed signal CED2D. Since the second delayed signal CED2, which is deactivated, is continuously inputted, the second inverter IVT2 will continuously output the power-saving signal STBEN, which is deactivated.

As described above with reference to FIG. 5, since the chip select signal CE may be delayed by the chip select signal delay block 160, the power-saving signal STBEN may be stably generated even though the state of the chip select signal CE is abruptly or unstably changed, for example, even though the chip select signal CE abruptly transitions to the activated state EN after the power-saving mode PSM is started.

Figure 6:
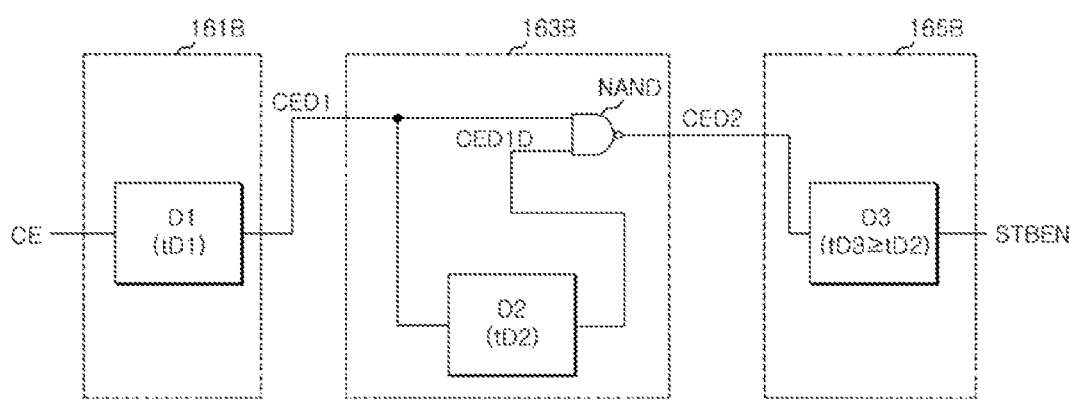
FIG. 6 is detailed diagram illustrating another example of a chip select signal delay block shown in FIG. 1.

FIG. 6 is a detailed diagram illustrating another example of the chip select signal delay block 160 shown in FIG. 1. Referring to FIG. 6, the chip select signal delay block 160 may include a first delay block 161B, a second delay block 163B, and a third delay block 165B.

The first delay block 161B may include a first delay circuit D1. The first delay circuit D1 may generate a first delayed signal CED1 by delaying the inputted chip select signal CE by a first delay time tD1.

The second delay block 163B may include a second delay circuit D2 and a NAND circuit NAND. The second delay circuit D2 may be coupled to the output terminal of the first delay circuit D1. The second delay circuit D2 may generate an internal delayed signal CED1D by delaying the first delayed signal CED1 by a second delay time tD2. The NAND circuit NAND may be coupled to the output terminal of the first delay circuit D1 and the output terminal of the second delay circuit D2. The NAND circuit NAND may compare the states of the first delayed signal CED1 and the internal delayed signal CED1D, and generate a second delayed signal CED2 based on a comparison result.

The third delay block 165B may include a third delay circuit D3. The third delay circuit D3 may be coupled to the output terminal of the NAND circuit NAND. The third delay circuit D3 may generate a power-saving signal STBEN by delaying the second delayed signal CED2 by a third delay time tD3 equal to or longer than the second delay time tD2.

Figure 7:
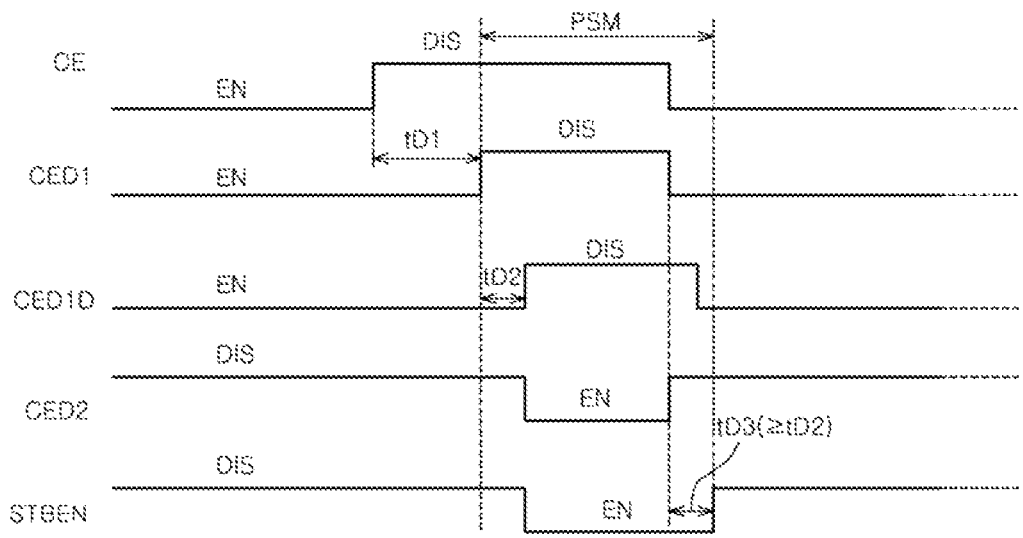
FIGS. 7 and 8 are timing diagrams for explaining operations of the chip select signal delay block shown in FIG. 6.

FIG. 7 is a timing diagram for explaining operations of the chip select signal delay block 160 shown in FIG. 6. A case in which the semiconductor memory device 100 starts a power-saving mode PSM when the predetermined time tD1 is passed after the chip select signal CE is deactivated as described above will be explained. Hereinafter, the operations of the chip select signal delay block in the case in which the chip select signal CE stably retains the deactivated state even after the power-saving mode PSM is started will be explained with reference to FIGS. 6 and 7.

If the chip select signal CE makes a transition from an activated state EN to a deactivated state DIS, the first delay circuit D1 may generate the first delayed signal CED1 by delaying the chip select signal CE by the first delay time tD1. For instance, the first delay circuit D1 may generate the first delayed signal CED1, which is delayed in its transition time (or a rising edge) by the first delay time tD1 only when the chip select signal CE makes a transition from the activated state EN to the deactivated state DIS.

The second delay circuit D2 may generate an internal delayed signal CED1D by delaying the first delayed signal CED1 by the second delay time tD2. The NAND circuit NAND may generate a second delayed signal CED2 when both the first delayed signal CED1 and the internal delayed signal CED1D are in deactivated states DIS. By the NAND circuit NAND, it may be possible to determine whether the first delayed signal CED1 is deactivated for a time longer than the second delay time tD2.

The third delay circuit D3 may generate a power-saving signal STBEN by delaying the second delayed signal CED2 by a third delay time tD3 equal to or longer than the second delay time tD2. For instance, the third delay circuit D3 may generate the power-saving signal STBEN, which is delayed in its transition time (or a rising edge) by the third delay time tD3 only when the second delayed signal CED2 makes a transition from the activated state EN to the deactivated state DIS.

Figure 8:
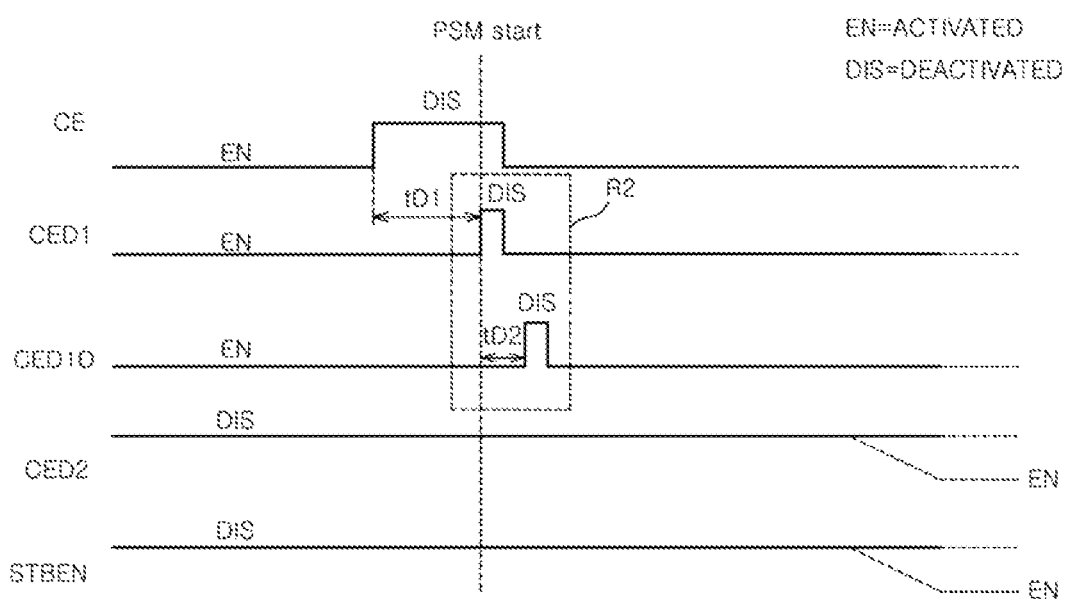

FIG. 8 is another timing diagram for explaining operations of the chip select signal delay block 160 shown in FIG. 6. The case in which the semiconductor memory device 100 starts the power-saving mode PSM when the predetermined time tD1 is passed after the chip select signal CE is deactivated will be explained. Hereinafter the operations of the chip select signal delay block in the case in which the chip select signal CE abruptly makes a transition to the activated state after the power-saving mode PSM is started will be explained with reference to FIGS. 6 and 8.

If the chip select signal CE makes a transition from the activated state EN to the deactivated state DIS, the first delay circuit D1 may generate the first delayed signal CED1 by delaying the chip select signal CE by the first delay time tD1. For instance, the first delay circuit D1 may generate the first delayed signal CED1, which is delayed in its transition time for a rising edge) by the first delay time tD1 only when the chip select signal CE makes a transition from the activated state EN to the deactivated state DIS.

The second delay circuit D2 may generate the internal delayed signal CED1D by delaying the first delayed signal CED1 by the second delay time tD2. The NAND circuit NAND may generate the second delayed signal CED2, which is activated, when both the first delayed signal CED1 and the internal delayed signal CED1D are in the deactivated states DIS.

However, because the chip select signal CE abruptly transitions to the activated state EN at about the time when the power-saving mode PSM is just started i.e., the first delayed signal CED1 does not retain the deactivated state DIS for a time longer than the second delay time tD2) and the first delayed signal CED1 is delayed by the second delay circuit D2, a case in which both the first delayed signal CED1 and the internal delayed signal CED1D are in the deactivated states DIS does not occur (see the region R2). For this reason, even though the power-saving mode PSM is started, the NAND circuit NAND may generate the second delayed signal CED2, which is deactivated.

The third delay circuit D3 may generate the power-saving signal STBEN by delaying the second delayed signal CED2 by the third delay time tD3 equal to or longer than the second delay time tD2. Since the second delayed signal CED2, which is deactivated, is continuously inputted, the third delay circuit D3 will also continuously generate the power-saving signal STBEN, which is deactivated.

As described above with reference to FIG. 8 since the chip select signal CE may be delayed by the chip select signal delay block 160, the power-saving signal STBEN may be stably generated even though the state of the chip select signal CE is abruptly or unstably changed, for example, even though the chip select signal CE abruptly transitions to the activated state EN after the power-saving mode PSM is started.

Figure 9:
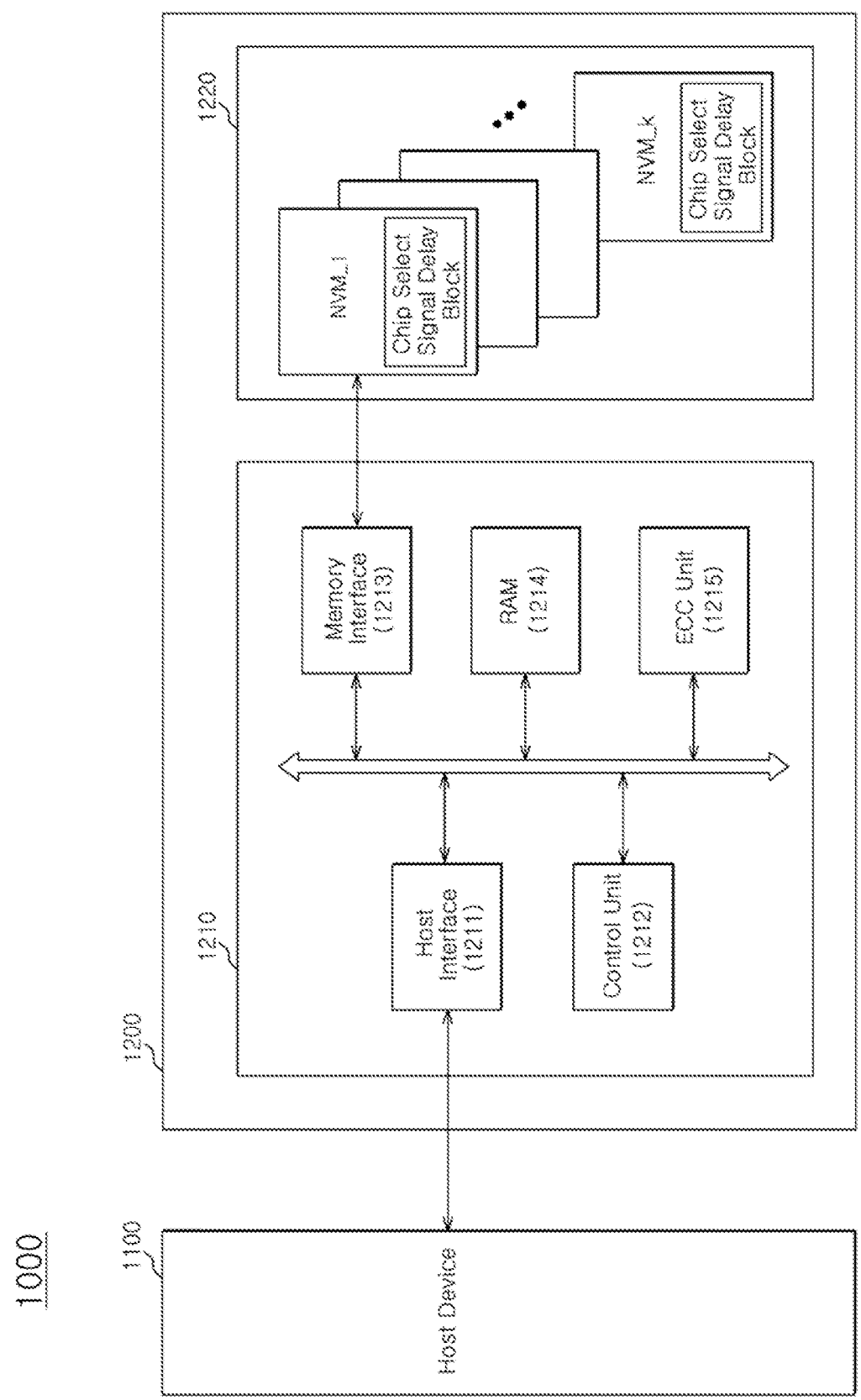
FIG. 9 is a block diagram illustrating a data processing system in accordance with an embodiment of the present invention.

FIG. 9 is a block diagram illustrating a data processing system 1000 in accordance with an embodiment of the present invention. Referring to FIG. 9, the data processing system 1000 may include a host device 1100 and a data storage device 1200.

The data storage device 1200 may include a controller 1210, and a semiconductor memory device 1220. The data storage device 1200 may be used by being electrically coupled to the host device 1100 such as a desktop computer, a laptop, a digital camera, a mobile phone, an MP3 player, a car entertainment system, and so forth. The data storage device 1200 is also referred to as a memory system.

The controller 1210 may access the semiconductor memory device 1220 in response to a request from the host device 1100. For example, the controller 1210 may control the read, program or erase operation of the semiconductor memory device 1220. The controller 1210 may drive firmware (or software) for controlling the semiconductor memory device 1220.

The controller 1210 may include component elements, which are well known in the art, such as a host interface 1211, a control unit 1212, a memory interface 1213, a RAM 1214 and an error correction code (ECC) unit 1215.

The control unit 1212 may control the general operations of the controller 1210 in response to a request from the host device 1100. The RAM 1214 may be used as a working memory of the control unit 1212. The RAM 1214 may temporarily store the data read from the semiconductor memory device 1220 or the data provided from the host device 1100.

The host interface 1211 may interface the host device 1100 and the controller 1210. For example, the host interface 1211 may communicate with the host device 1100 through one of various interface protocols such as a universal flash storage (UFS) protocol, a universal serial bus (USB) protocol, a multimedia card (MMC) protocol, a peripheral component interconnection (PCI) protocol, a PCI express (PCI-E) protocol, a parallel advanced technology attachment (PATA) protocol, a serial advanced technology attachment (SATA) protocol, a small computer system interface (SCSI) protocol, and a serial attached SCSI (SAS) protocol.

The memory interface 1213 may interface the controller 1210 and the semiconductor memory device 1220. The memory interface 1213 may provide a command, an address and a control signal, for example, a chip select signal, to the semiconductor memory device 1220. Furthermore, the memory interface 1213 may exchange data with the semiconductor memory device 1220.

The error correction code unit 1215 may detect an error of the data read from the semiconductor memory device 1220. Also, the error correction code unit 1215 may correct the detected error when the detected error falls within a correctable range. Meanwhile, the error correction code unit 1215 may be provided inside or outside of the controller 1210 depending on the memory system 1000.

The semiconductor memory device 1220 may be used as a storage medium of the data storage device 1200. For instance, the semiconductor memory device 1220 may include a plurality of nonvolatile memory devices (or dies) NVM_1 to NVM_k. Each of the semiconductor memory devices NVM_1 to NVM_k may include a chip select signal delay block in accordance with the embodiment of the present invention. For this reason, even though the state of a chip select signal is abruptly or unstably changed, for example, even though the chip select signal abruptly makes a transition from a deactivated state to an activated state after a power-saving mode is started, a power-saving signal for controlling the entry to the power-saving mode may be stably generated.

The controller 1210 and the semiconductor memory device 1220 may be integrated into one semiconductor device and may be configured as a memory device. For example, the controller 1210 and the semiconductor memory device 1220 may be integrated into one semiconductor apparatus and may be configured as a memory device such as a multimedia card (e.g., an MMC, an eMMC, an RS-MMC and a micro-MMC), a secure digital card (e.g., an SD, a mini-SD and an micro-SD), a universal serial bus (USB) storage device, a universal flash storage (UFS) device, a personal computer memory card international association (PCMCIA) card, a compact flash (CF) card, a smart media card, and a memory stick.

Figure 10:
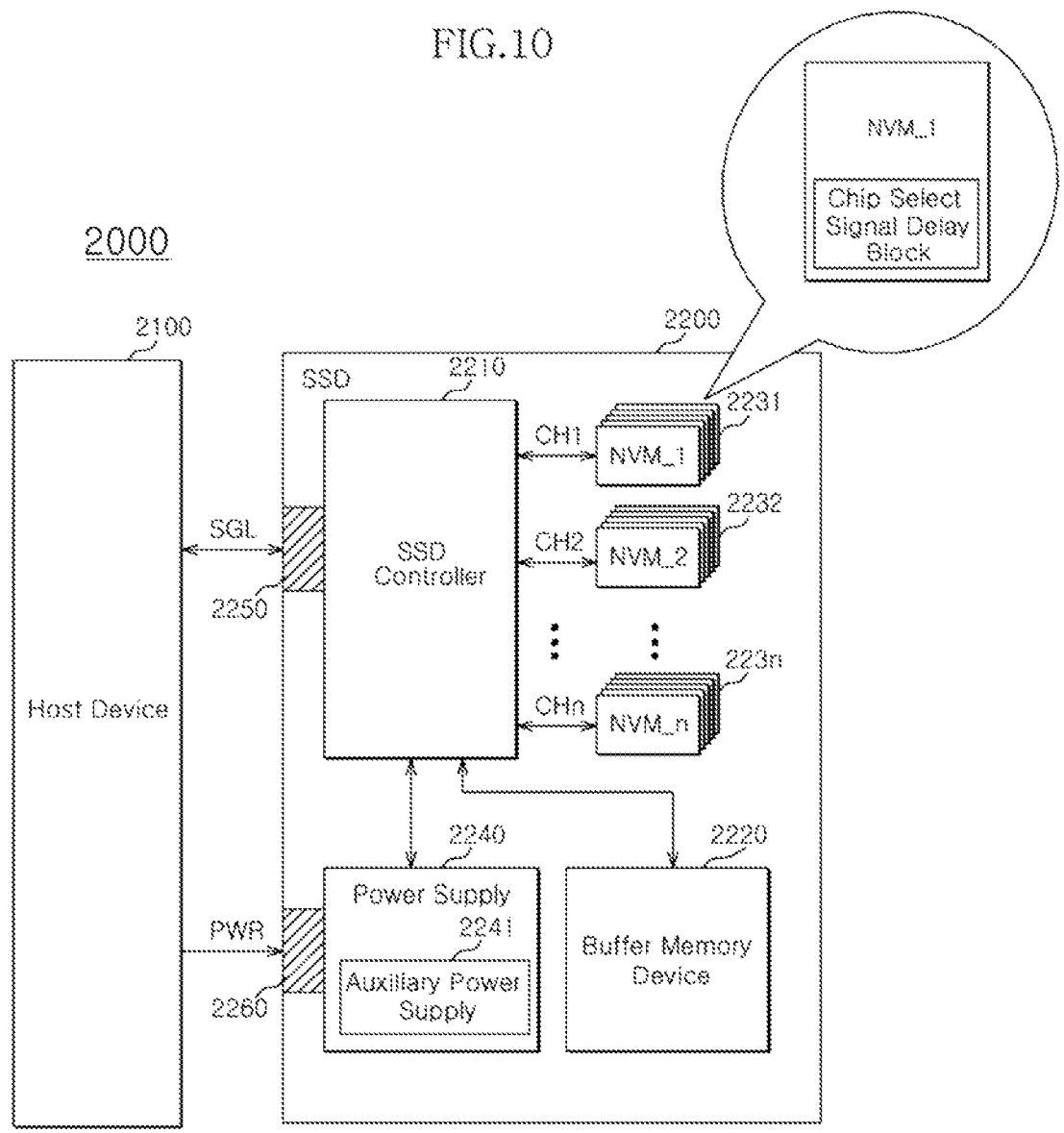
FIG. 10 is a block diagram illustrating a data processing system including a solid-state drive (SSD) in accordance with an embodiment of the present invention.

FIG. 10 is a block diagram illustrating a data processing system 2000 including a solid-state drive (SSD) in accordance with an embodiment of the present invention. Referring to FIG. 10, the data processing system 2000 may include a host device 2100 and an SSD 2200.

The SSD 2200 may include an SSD controller 2210, the buffer memory device 2220, semiconductor memory devices 2231 to 223n, a power supply 2240, a signal connector 2250, and a power connector 2260.

The SSD 2200 may operate in response to a request from the host device 2100. That is, the SSD controller 2210 may access the semiconductor memory devices 2231 to 223n in response to a request from the host device 2100. For example, the SSD controller 2210 may control the read, program and erase operations of the semiconductor memory devices 2231 to 223n.

The buffer memory device 2220 may temporarily store data to be stored in the semiconductor memory devices 2231 to 223n. Further, the buffer memory device 2220 may temporarily store data read from the semiconductor memory devices 2231 to 223n. The data temporarily stored in the buffer memory device 2220 may be transmitted to the host device 2100 or the semiconductor memory devices 2231 to 223n under the control of the SSD controller 2210.

The semiconductor memory devices 2231 to 223n may be used as storage media of the SSD 2200. The semiconductor memory devices 2231 to 223n may be electrically coupled to the SSD controller 2210 through a plurality of channels CH1 to CHn, respectively. One or more semiconductor memory devices may be electrically coupled to one channel. The semiconductor memory devices electrically coupled to one channel may be electrically coupled to the same signal bus and data bus.

For instance, the semiconductor memory devices 2231 to 223n may include a plurality of nonvolatile memory devices. Each of the semiconductor memory devices 2231 to 223n may include a chip select signal delay block in accordance with the embodiment of the present invention. For this reason, even though the state of a chip select signal is abruptly or unstably changed, for example, even though the chip select signal abruptly transitions from a deactivated state to an activated state after a power-saving mode is started, a power-saving signal for controlling the entry to the power-saving mode may be stably generated.

The power supply 2240 may provide power PWR inputted through the power connector 2260, to the inside of the SSD 2200. The power supply 2240 may include an auxiliary power supply 2241. The auxiliary power supply 2241 may supply power to allow the SSD 2200 to be normally terminated when a sudden power-off occurs. The auxiliary power supply 2241 may include super capacitors capable of being charged with power PWR.

The SSD controller 2210 may exchange a signal (i.e., SGL) with the host device 2100 through the signal connector 2250. The signal SGL may include a command, an address, a control signal, data, and so forth. The signal connector 2250 may include a connector having any one protocol of a parallel advanced technology attachment (PATA), a serial advanced technology attachment (SATA), a small computer system interface (SCSI), a serial attached SCSI (SAS), a peripheral component interconnection (PCI), a PCI express (PCI-E) protocol, depending on an interface scheme between the host device 2100 and the SSD 2200.

Figure 11:
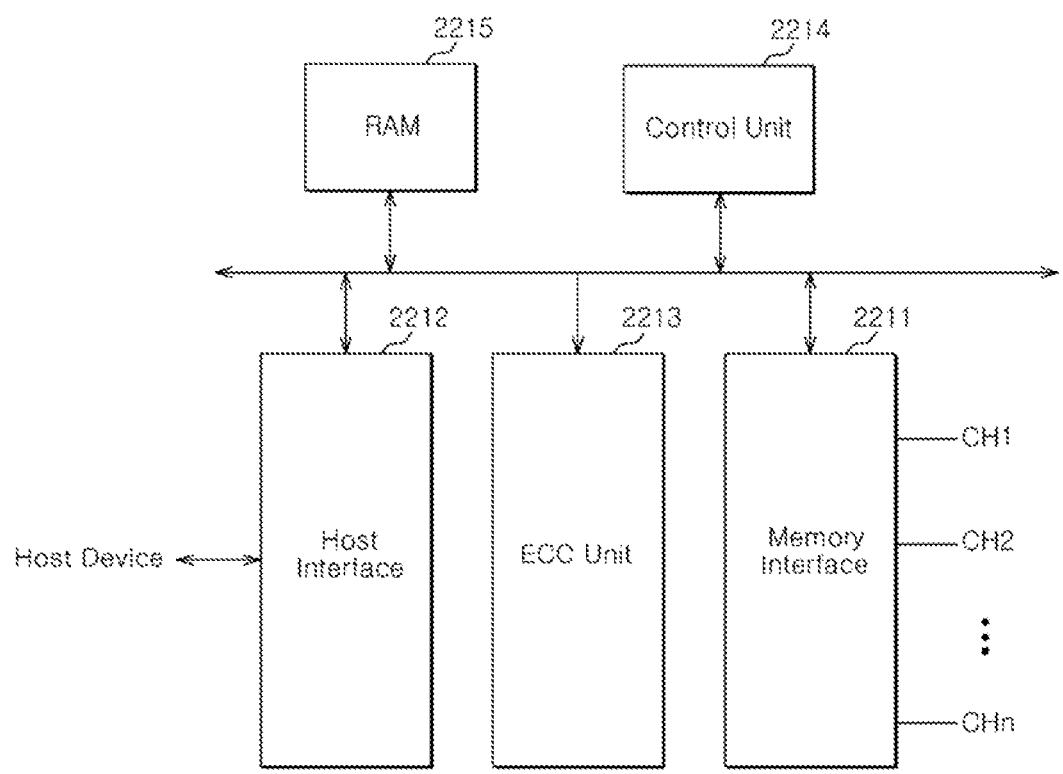
FIG. 11 is a detailed block diagram of an SSD controller shown in FIG. 10.

FIG. 11 is a detailed diagram of the SSD controller shown in FIG. 10. Referring to FIG. 11 the SSD controller 2210 may include a memory interface 2211, a host interface 2212, an error correction code (ECC) unit 2213, a control unit 2214, and a RAM 2215.

The memory interface 2211 may provide a command and an address to the semiconductor memory devices 2231 to 223n. Moreover, the memory interface 2211 may exchange data with the semiconductor memory devices 2231 to 223n. The memory interface 2211 may scatter the data transmitted from the buffer memory device 2220 to the respective channels to CHn, under the control of the control unit 2214. Furthermore the memory interface 2211 may transfer the data read from the semiconductor memory devices 2231 to 223n to the buffer memory device 2220 under the control of the control unit 2214.

The host interface 2212 may provide an interface with the SSD 2200 in correspondence to the protocol of the host device 2100. For example, the host interface 2212 may communicate with the host device 2100 through any one protocol of a parallel advanced technology attachment (PATA), serial advanced technology attachment (SATA), a small computer system interface (SCSI), a serial attached SCSI (SAS), a peripheral component interconnection (PCI) and a PCI express (PCI-E). In addition, the host interface 2212 may perform a disk emulating function of supporting the host device 2100 to recognize the SSD 2200 as a hard disk drive (HDD).

The ECC unit 2213 may generate parity bits based on the data transmitted to the semiconductor memory devices 2231 to 223n. The generated parity bits may be stored in spare areas of the semiconductor memory devices 2231 to 223n. The ECC unit 2213 may detect an error of the data read from the semiconductor memory devices 2231 to 223n. When the detected error falls within a correctable range, the ECC unit 2213 may correct the detected error.

The control unit 2214 may analyze and process a signal (i.e., SGL) inputted from the host device 2100. The control unit 2214 may control the general operations of the SSD controller 2210 in response to a request from the host device 2100. The control unit 2214 may control the operations of the buffer memory device 2220 and the semiconductor memory devices 2231 to 223n based on a firmware for driving the SSD 2200. The RAM 2215 may be used as a working memory for driving the firmware.

Figure 12:
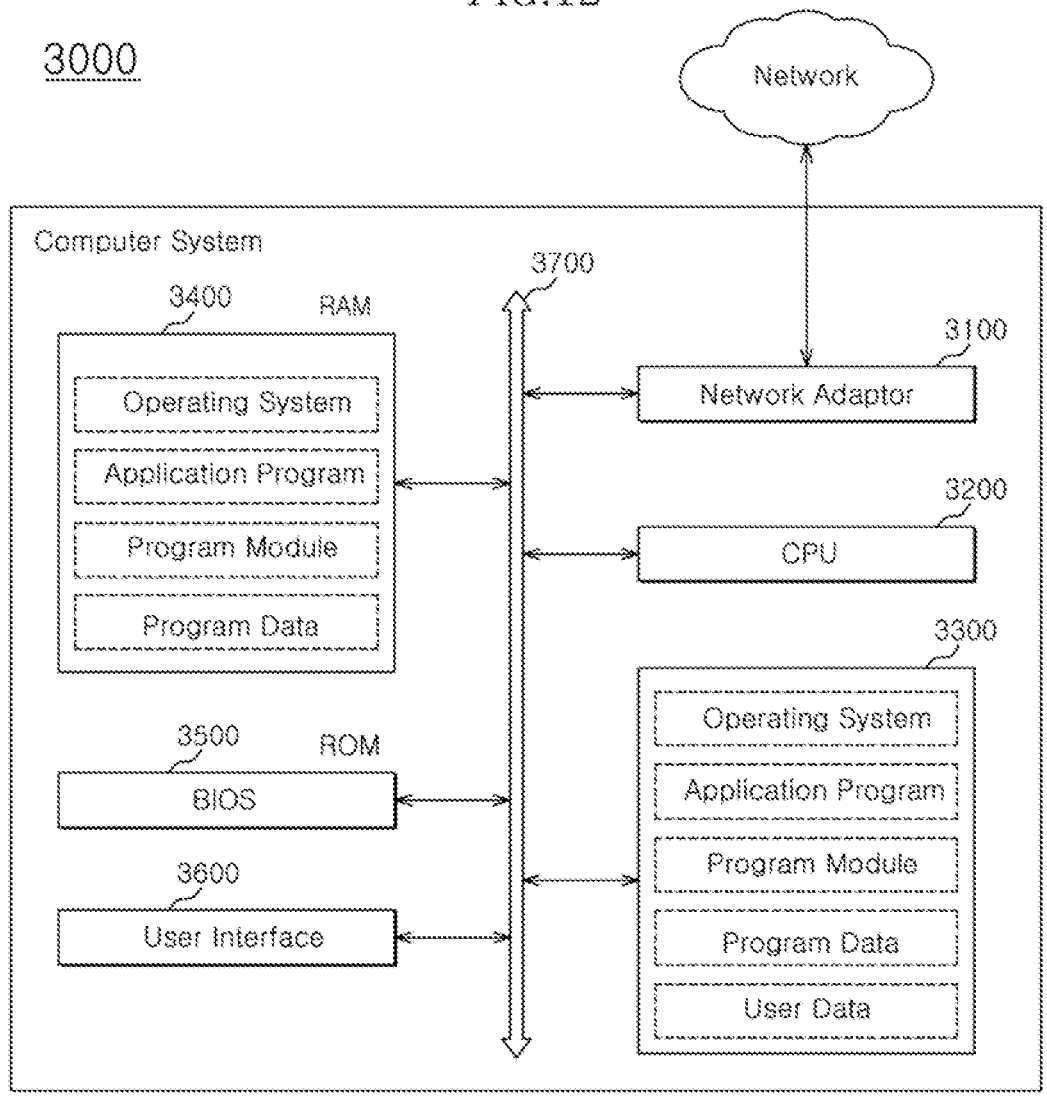
FIG. 12 is a block diagram illustrating a computer system including a data storage device in accordance with the embodiment of the present invention.

FIG. 12 is a block diagram illustrating a computer system 3000 including the data storage device in accordance with the embodiment of the present invention. Referring to FIG. 12, the computer system 3000 may include a network adaptor 3100, a central processing unit 3200, a data storage device 3300, a RAM 3400, a ROM 3500 and a user interface 3600, which are electrically coupled to a system bus 3700. The data storage device 3300 may include the data storage device 1200 shown in FIG. 9 or the SSD 2200 shown in FIG. 10.

The network adaptor 3100 provides interfacing between the computer system 3000 and external networks. The central processing unit 3200 performs general operations for driving an operating system residing at the RAM 3400 or an application program.

The data storage device 3300 stores general data used in the computer system 3000. For example, an operating system for driving the computer system 3000, an application program, various program modules, program data, and user data are stored in the data storage device 3300.

The RAM 3400 may be used as a working memory of the computer system 3000. Upon booting, the operating system, the application program, the various program modules and the program data used for driving programs, which are read from the data storage device 3300, are loaded on the RAM 3400. A basic input/output system (BIOS), which is activated before the operating system is driven, is stored in the ROM 3500. Information exchange between the computer system 3000 and a user is implemented through the user interface 3600.

Although not shown in FIG. 12, the computer system 3000 may further include devices such as an application chipset, a camera image processor, and so forth.

While certain embodiments have been described above, it will be understood to those skilled in the art that the embodiments described are by way of example only. Accordingly, the semiconductor memory device and the data storage device including the same described herein should not be limited based on the described embodiments. Rather, the semiconductor memory device and the data storage device including the same described herein should only be limited in light of the claims that follow.

What is claimed is:

1. A semiconductor memory device comprising:
a memory cell array;
a voltage generator suitable for generating voltages used for accessing the memory cell array in response to a power-saving signal; and
a control logic suitable for generating the power-saving signal that is activated when the chip select signal retains a deactivated state for a reference period or longer after an entry of a power-saving mode,
wherein the control logic comprises:
a first delay block suitable for generating a first delayed signal by delaying an edge of the chip select signal by a first delay time;
a second delay block suitable for determining whether the first delayed signal is deactivated for the reference period or more, and generating a second delayed signal based on the determination result; and
a third delay block suitable for generating the power-saving signal by delaying an edge of the second delayed signal by a third delay time, which is equal to or longer than the second delay time.

2. A semiconductor memory device comprising:
a memory cell array;
a voltage generator suitable for generating voltages used for controlling the memory cell array in response to a power-saving signal; and
a control logic suitable for providing the power-saving signal to the voltage generator, based on a chip select signal,
wherein the control logic includes a delay block suitable for delaying the chip select signal and generating the power-saving signal based on the delayed chip select signal,
wherein the delay block comprises:
a first delay block suitable for generating a first delayed signal by delaying the chip select signal by a first delay time;
a second delay block suitable for determining whether or not the first delayed signal is deactivated for a time longer than a second delay time, and generating a second delayed signal based on the determination result; and
a third delay block suitable for generating the power-saving signal by delaying the second delayed signal by a third delay time,
wherein the third delay block generates the power-saving signal by delaying the second delayed signal by the third delay time equal to or longer than the second delay time.

3. The semiconductor memory device according to claim 2, wherein, when the first delayed signal is deactivated for a time longer than the second delay time, the second delay block generates the second delayed signal that is activated, and the third delay block generates the power-saving signal for deactivating the voltage generator, based on the second delayed signal that is activated.

4. The semiconductor memory device according to claim 2, wherein, when the first delayed signal is deactivated for a time shorter than the second delay time, the second delay block generates the second delayed signal that is deactivated, and the third delay block generates the power-saving signal for activating the voltage generator, based on the second delayed signal that is deactivated.

5. The semiconductor memory device according to claim 2, wherein the first delay block generates the first delayed signal by delaying the chip select signal by the first delay time when the chip select signal transitions from an activated state to a deactivated state.

6. The semiconductor memory device according to claim 2, wherein the third delay block generates the power-saving signal by delaying the second delayed signal by the third delay time when the second delayed signal transitions from an activated state to a deactivated state.

7. The semiconductor memory device according to claim 2, wherein the first delay block comprises:
a first delay circuit suitable for generating the first delayed signal based on the chip select signal.

8. The semiconductor memory device according to claim 7, wherein the second delay block comprises:
a first inverter suitable for generating a first inverted signal by inverting the first delayed signal;
a second delay circuit suitable for generating a first internal delayed signal based on the first inverted signal; and
an OR circuit suitable for determining whether the first delayed signal is deactivated for a time longer than the second delay time, based on the first inverted signal and the first internal delayed signal, and selectively activating the second delayed signal based on the determination result.

9. The semiconductor memory device according to claim 8, wherein the third delay block comprises:
a third delay circuit suitable for generating a second internal delayed signal based on the second delayed signal, and
a second inverter suitable for generating the power-saving signal by inverting the second internal delayed signal.

10. The semiconductor memory device according to claim 7, wherein the second delay block comprises:
a second delay circuit suitable for generating an internal delayed signal based on the first delayed signal; and
a NAND circuit suitable for determining whether the first delayed signal is deactivated for a time longer than the second delay time, based on the first delayed signal and the internal delayed signal, and selectively activating the second delayed signal based on the determination result.

11. The semiconductor memory device according to claim 10, wherein the third delay block comprises:
a third delay circuit suitable for generating the power-saving signal based on the second delayed signal.

12. A data storage device comprising:
a semiconductor memory device; and
a controller suitable for accessing the semiconductor memory device in response to a request from a host device,
wherein the semiconductor memory device comprises:
a memory cell array;
a voltage generator suitable for generating voltages used for controlling the memory cell array in response to a power-saving signal; and
a control logic suitable for providing the power-saving signal to the voltage generator based on a chip select signal provided from the controller, wherein the control logic includes a delay block suitable for delaying the chip select signal and generating the power-saving signal based on the delayed chip select signal,
wherein the delay block comprises:

a first delay block suitable for generating a first delayed signal by delaying the chip select signal by a first delay time;

a second delay block suitable for determining whether or not the first delayed signal is deactivated for a time longer than a second delay time, and generating a second delayed signal based on the determination result; and a third delay block suitable for generating the power-saving signal by delaying the second delayed signal by a third delay time, wherein the third delay block generates the power-saving signal by delaying the second delayed signal by the third delay time equal to or longer than the second delay time.

13. The data storage device according to claim 12, wherein, when the first delayed signal is deactivated for a time longer than the second delay time, the second delay block generates the second delayed signal that is activated, and the third delay block generates the power-saving signal for deactivating the voltage generator, based on the second delayed signal that is activated.

14. The data storage device according to claim 12, wherein the first delay block comprises:

a first delay circuit suitable for generating the first delayed signal based on the chip select signal.

15. The data storage device according to claim 14, wherein the second delay block comprises:

a first inverter suitable for generating a first inverted signal by inverting the first delayed signal;

a second delay circuit suitable for generating a first internal delayed signal based on the first inverted signal; and an OR circuit suitable for determining whether the first delayed signal is deactivated for a time longer than the second delay time, based on the first inverted signal and the first internal delayed signal, and selectively activating the second delayed signal based on the determination result.

16. The data storage device according to claim 15, wherein the third delay block comprises:

a third delay circuit suitable for generating a second internal delayed signal based on the second delayed signal, and a second inverter suitable for generating the power-saving signal by inverting the second internal delayed signal.

17. The data storage device according to claim 14, wherein the second delay block comprises:

a second delay circuit suitable for generating an internal delayed signal based on the first delayed signal; and a NAND circuit suitable for determining whether the first delayed signal is deactivated for a time longer than the second delay time based on the first delayed signal and the internal delayed signal, and selectively activating the second delayed signal based on a determination result.

18. The data storage device according to claim 17, wherein the third delay block comprises:

a third delay circuit suitable for generating the power-saving signal based on the second delayed signal.

* * * * *